United States Patent [19]

Beyerbach et al.

[11] Patent Number: 4,686,458

[45] Date of Patent: Aug. 11, 1987

[54] PULSE ALIGNMENT SYSTEM

[75] Inventors: Daniel M. Beyerbach, Anaheim; William L. Scott, Whittier, both of Calif.; Robert W. Goczalk, Acton, Mass.

[73] Assignee: Hughes Aircraft Company, Los Angeles, Calif.

[21] Appl. No.: 740,113

[22] Filed: May 31, 1985

[51] Int. Cl.4 .................................... G01R 25/00
[52] U.S. Cl. ................................ 324/83 D; 328/176; 377/50
[58] Field of Search ............... 324/83 D, 77 R, 77 A, 324/77 G, 73 R, 140 R, 79 R; 328/175, 176, 103, 133, 119; 307/511, 516; 377/12, 50

[56] References Cited

U.S. PATENT DOCUMENTS

| | | | |
|---|---|---|---|
| 3,465,338 | 5/1968 | McFarland | 343/17.1 |
| 3,868,567 | 2/1975 | Ekstrom | 324/77 A |
| 3,882,390 | 5/1975 | Lucas | 324/73 R |
| 3,982,184 | 9/1976 | Sanderson | 324/83 D |
| 3,986,113 | 10/1976 | Vifian | 324/79 R |
| 4,000,471 | 12/1976 | Pankow | 328/175 |
| 4,097,801 | 6/1978 | Freeman | 324/77 G |
| 4,371,830 | 2/1983 | Loucks | 328/176 |
| 4,504,749 | 3/1985 | Yoshida | 307/590 |
| 4,584,710 | 4/1986 | Hansen | 324/83 D |

OTHER PUBLICATIONS

PCT International Search Report PCT/US 86/01125.
Radar Handbook, M. I. Skolnik, pp. 21-42 thru 21-45 Published 1970 McGraw-Hill.

Primary Examiner—Michael J. Tokar
Attorney, Agent, or Firm—Thomas A. Runk; A. W. Karambelas

[57] ABSTRACT

A system for automatic alignment of two pulses is disclosed. The disclosed system is particularly adapted to align the cathode current pulse supplied to a TWT amplifier with the RF exciter pulse so as to improve the efficiency of the TWT amplifier. The system includes a programmable delay circuit for selectively delaying the cathode current pulse after the system trigger. A pulse alignment signal indicates when the two pulses are in alignment. A system controller carries out a calibration algorithm to interatively change the delay while monitoring the alignment signal to determine the calibrated delay setting resulting in pulse alignment. The calibrated delay setting is then stored in memory, and is employed by the controller during the normal operation mode to adjust the programmable delay circuit to the calibrated value.

18 Claims, 5 Drawing Figures

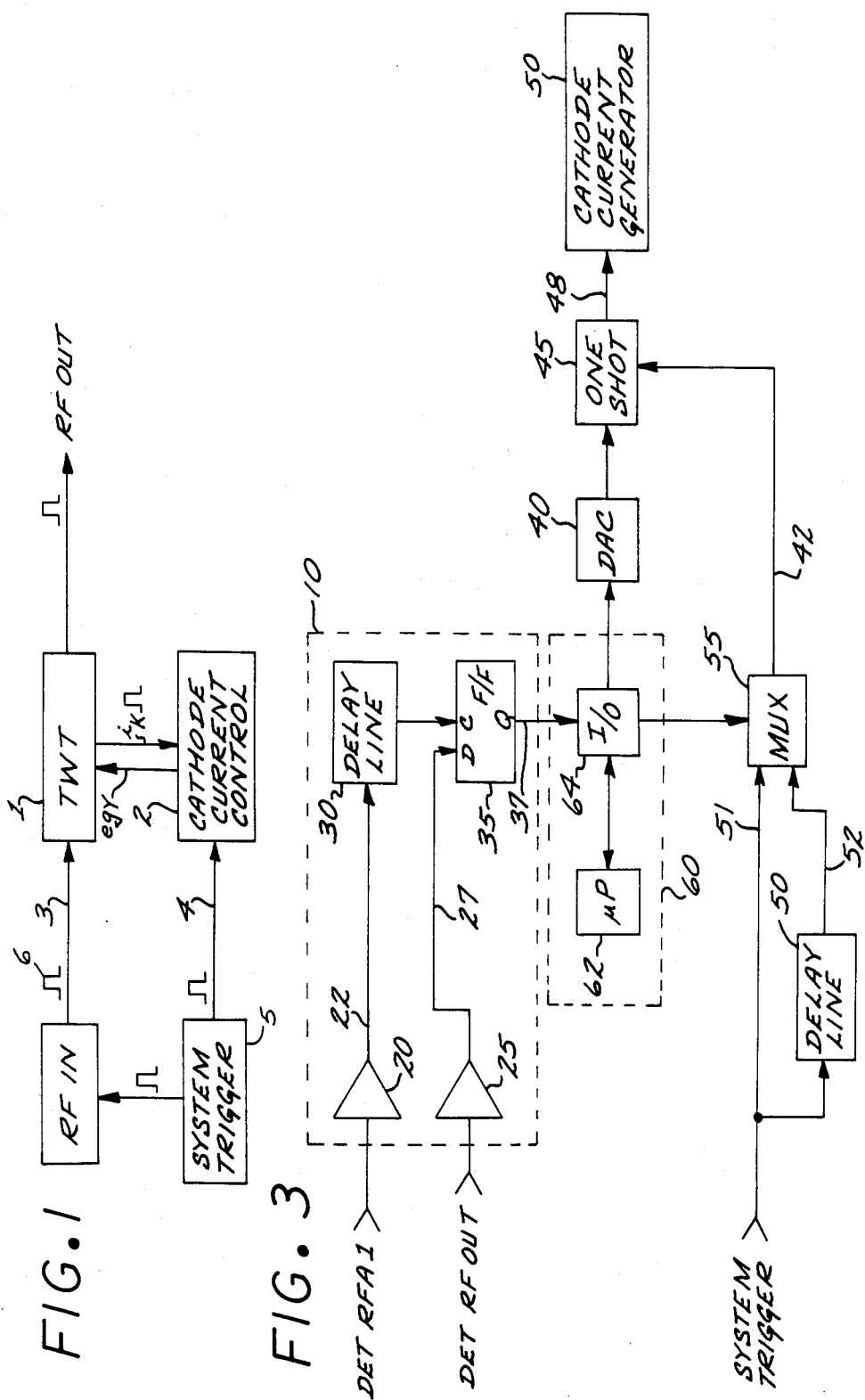

PULSE ALIGNMENT SYSTEM

The Government has rights to this invention pursuant to Contract No. DAAK20-81-C-0390 awarded by the Department of the Army.

BACKGROUND OF THE INVENTION

The present invention is useful for aligning two pulses, and more particularly for varying the delay of one pulse in relation to a reference signal until that pulse is conincident with the second pulse.

Travelling wave tube (TWT) amplifiers are in widespread use for high gain amplification of radio frequency (RF) signals. To obtain the amplified RF power from the TWT, it is necessary for the input RF signal to be provided to the TWT at the same time the cathode current is applied. TWT amplifiers are often operated in pulsed applications and when employed with a duty factor above 1%, liquid cooling of the TWT is typically required for reliable operation. In certain applications, liquid cooling is undesirable due to weight, bulk, or other reasons. Where high power levels are required and liquid cooling cannot be used it becomes essential to maximize the efficiency of air-cooled, pulsed TWT amplifier.

Optimum performance of a pulsed TWT amplifier requires coincidence of the RF input pulse with the TWT cathode current. A system trigger signal is normally employed as a reference. The TWT cathode current pulse is started after a fixed delay from the leading edge of the system trigger pulse. The RF exciter pulse or input RF signal to the TWT is also typically started at a predetermined time interval after the leading edge of the system trigger pulse. If the delay for starting the cathode current pulse is too small, the cathode current beam pulse energy and TWT duty cycle are wasted during the early part of the beam period before the RF input signal is applied, resulting in a reduction of the amplified RF pulse width. Conversely, too long a delay in starting the cathode current pulse results in wasted cathode current beam pulse energy and TWT duty cycle during the latter part of the beam period after the RF input pulse has ended, with a resultant reduction of the amplified RF pulse width. The desired situation for efficiency is a coincident RF input pulse with a cathode current pulse so that energy is wasted from neither pulse.

Insofar as is known to applicants, the timing adjustment to align the RF input pulse for coincidence with the TWT beam current pulse has heretofore been performed manually, with the operator employing an oscilloscope to display the two pulses and manually adjusting the cathode current pulse delay to obtain coincidence with the RF input pulse to the TWT. A moderate degree of operator skill and experience are required as well as the time to make this adjustment properly. Under certain field conditions, it is undersirable to require the use of test equipment, experienced maintenance personnel, and relatively long times to align the pulses.

It would be an advance in the art to provide a means for minimizing the necessity for field operator intervention during field alignment of TWT RF amplifier equipment.

It would further be advantageous to provide a means for aligning automatically two pulses without the need for operator intervention and the concommitant potential for erroneous adjustment.

It would further be advantageous to be able to align the pulses frequently and with relatively little equipment "down-time" in the case where the equipment operating environment varies drastically and such variances may affect alignments.

SUMMARY OF THE INVENTION

A system is disclosed for automatically aligning first and second pulses. In accordance with the invention, a variable time delay means is provided to delay the first pulse by a delay time interval after a trigger signal. The alignment of the first and second pulses is sensed and a coincidence signal is generated which has a first state if the variable time delay is too short, i.e., the first pulse starts before the second pulse, and a second state if the variable time delay is too long, i.e., the first pulse starts after the second pulse. The system is operable in a calibration mode, during which a system controller automatically determines the appropriate time delay to obtain coincidence of the two pulses by processing the coincidence signal.

In the calibration mode, the controller initializes the variable time delay means to provide the minimum time delay, and controls the variable time delay means to progressively increase the time delay in relatively large steps while the coincidence signal is monitored by the controller. Once the coincidence signal changes from the first state to the second state, then the controller controls the variable delay means to progressively decrease the time delay in relatively small steps until the coincidence signal changes state again, this time from the second state to the first state. The resultant amount of time delay or "time delay parameter" resulting in the second change of state of the coincidence signal is stored in memory as the calibrated parameter resulting in coincidence of the first and second pulses. During the normal operating mode, the controller sets the variable time delay means to the calibrated parameter.

BRIEF DESCRIPTION OF THE DRAWINGS

These and other features and advantages of the present invention will become more apparent from the following detailed description of an exemplary embodiment thereof, as illustrated in the accompanying drawings, in which:

FIG. 1 is a general block diagram of a TWT amplifier;

FIG. 3 is a schematic block diagram of the preferred embodiment of the invention.

DETAILED DESCRIPTION OF THE PREFERRED EMBODIMENT

The present invention comprises a novel pulse alignment system for aligning two pulse signals. The following description is presented to enable a person skilled in the art to make and use the invention, and is provided in the context of a particular application and its requirements. Various modifications to the preferred embodiment may become apparent to those skilled in the art, however, and the present invention is not intended to be limited to the embodiment shown, but is to be accorded the widest scope consistent with the principles and novel features disclosed herein.

One application for which the invention is particularly suited is the alignment of a TWT amplifier cathode current pulse with the RF input or exciter pulse. This application is illustrated in the simplified block diagram of a TWT amplifier of FIG. 1 and the timing diagrams of FIGS. 2A and 2B. The TWT 1 receives RF input pulses 6 on line 3 and includes a high voltage circuit (not shown) and a cathode current control 2 to apply the grid voltage egy and to develop the TWT cathode current $i_k$ and TWT power. A system trigger 5 actuates the current control 2 by line 4 and the RF input signal pulses 6.

Figure 2A:
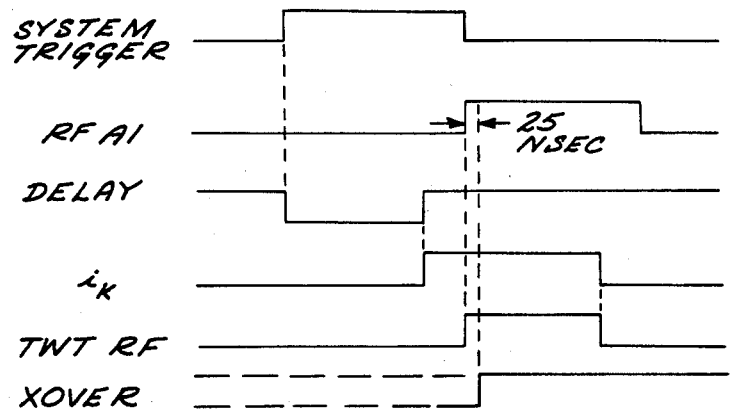
FIGS. 2A and 2B are timing diagram illustrating opposite cases of misalignment between two pulses, the RF input pulse and the TWT cathode current pulse.

The TWT amplifier will radiate RF output power only when there is a coincidence between the cathode beam current pulse $i_k$ and the RF input ("RFA1") pulse to the TWT. The RFA1 pulse is applied to the TWT after a predetermined time interval (typically one microsecond) from the leading edge of the system trigger pulse. The cathode current control applies the $i_k$ pulse after a certain delay from the leading edge of the system trigger. This timing is illustrated in FIG. 2A where the TWT output RF power ("TWT RF") begins when the RF input pulse ("RFA1") goes high, and terminates with the beam current $i_k$ going low. Thus, the TWT RF pulse is shorter than both the RFA1 pulse and the $i_k$ pulse. This is due to the "out-of-coincidence" timing of these two pulses.

The delay time from the leading edge of the system trigger to the leading edge of the cathode current pulse $i_k$ is typically adjustable. Conventionally, this delay time has been adjusted manually to obtain coincidence of the RF input pulse RFA1 and the cathode current pulse $i_k$. When the pulses are misaligned as a result of too little delay of the $i_k$ pulse, the cathode current pulse $i_k$ is started too soon as shown in FIG. 2A. Since the current pulse length is typically fixed, the RFA1 pulse only partly overlaps the $i_k$ pulse and the resultant TWT RF pulse width is reduced, wasting cathode current pulse energy and reducing the effective TWT duty cycle.

Figure 2B:
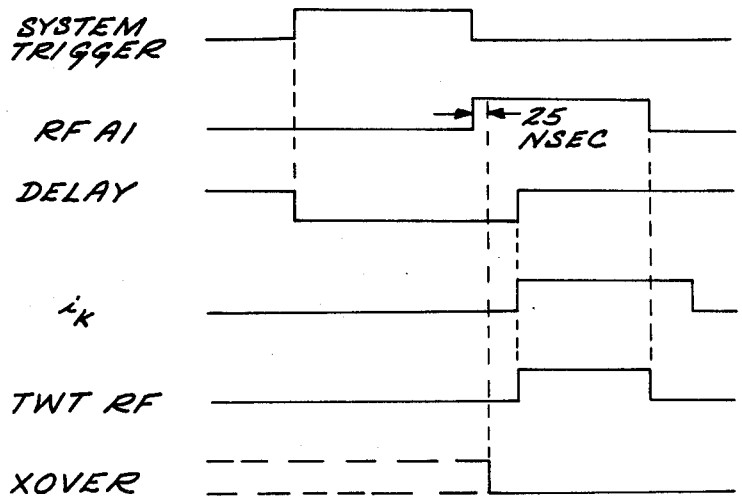

FIG. 2B illustrates the converse situation in which the pulses are misaligned due to too much delay between the system trigger and the $i_k$ pulse. In this case, the cathode current pulse is started too late. This misalignment with the RFA1 pulse also results in a reduction of the TWT output RF pulse width and the TWT duty cycle, as well as again, a waste of cathode current pulse energy.

In accordance with the invention, the prior technique of manual adjustment of the delay introduced between the system trigger and the cathode current pulse has been replaced by a system for automatically aligning the two pulses. The system utilizes the RF input pulse, typically provided by a first stage solid state RF amplifier, as a time reference for adjusting the cathode current delay and the TWT RF output.

In FIG. 2A, the TWT RF pulse extends from the leading edge of the RF input pulse RFA1 until the trailing edge of the cathode current pulse $i_k$. This overlap enables the cathode current to modify the pulse length of the detected TWT RF signal. Thus, it is noted that 25 nanoseconds after the leading edge of the RF input pulse, TWT RF is present in the situation of "too little" delay illustrated in FIG. 2A, but is not present 25 nanoseconds after the leading edge of the RF input pulse for the "too much" delay situation illustrated in FIG. 2B. (The 25 nanosecond delay is introduced by a delay line employed in the disclosed embodiment, as will be described more fully below, to compensate for the nominal set-up time of a digital device employed in the disclosed embodiment.) This simple example is illustrative of detected conditions of either too much or too little delay in starting the cathode current pulse.

In the preferred embodiment, a coincidence signal having two possible states is generated. This signal, the cross-over bit XOVER, has a high state when the cathode current pulse delay from the system trigger is too small for the current pulse to coincide with the RF input signal pulse, and a low state when the delay is too large.

The crossover bit XOVER is illustrated in FIGS. 2A and 2B, and is at the high state in FIG. 2A when the cathode current pulse is applied to the TWT before the input signal RFA1 is present, i.e., when the cathode current delay is too small. In FIG. 2B, the crossover bit is at the low state with the cathode current pulse $i_k$ applied after the input signal RFA1 is applied to the TWT, i.e., when the cathode current delay is too large. (In each case, the referencing of the crossover bit to the RFA1 pulse is delayed by the 25 nanosecond delay line referred to above.)

In the application in which the preferred embodiment is employed, the cathode current pulse is slightly longer than the RF input signal pulse RFA1, with both pulses typically in the microsecond range. It is desired that the cathode current pulse begin about 50 nanoseconds before the RF input signal pulse is applied to the TWT to accommodate the rise time of the cathode current pulse.

FIG. 3 is a simplified functional block diagram of the preferred embodiment. The crossover detector 10 is adapted to generate the XOVER bit illustrated in FIGS. 2A and 2B. The detector 10 comprises comparators 20 and 25 for providing binary-leveled signals indicative of "on" or "off" conditions of the input signal RFA1 and the TWT RF output signal, respectively. The comparator devices are configured as threshold detectors to compare the level of the respective input signal level against a reference signal level and detect whether the input signal level exceeds the threshold level.

The input to comparator 20 is a signal whose level is representative of the detected power level of the RF input signal to the TWT. The input to comparator 25 is a signal whose level is representative of the detected power of the TWT RF output signal. RF couplers are employed to couple a fraction of the RF input power and the TWT RF output power to respective RF detector devices. These detector devices may comprise the model MA77001-0100 detector marketed by M/A COM Gallium Arsenide Products Incoporated, 43 South Avenue, Burlinton, Mass.

The comparator 20, 25 threshold levels are adjusted so that the comparator output is low with no significant RF power levels, and high when significant power is detected for the respective RF input signal or the TWT RF output. Comparators 20 and 25 may comprise units of a precision quad comparator such a model HA-4900, marketed by the Harris Semiconductor Products division of the Harris Corporation, P.O. Box 883, Melbourne, Fla.

The output of comparator 20 is provided on line 22 to delay line 30, such as a delay line, part number 0447-0050-05, marketed by Bell Fuse, Incorporated, 198 Van Vorst Street, Jersey City, N.J., configured to provide a 25 nanosecond delay to the input signal. The output of the delay line is provided as the clock "C" input to the flip-flop 35.

The binary-leveled signal corresponding to the detected TWT RF signal is provided on line 27 as the data "D" signal to the flip-flop 35. The flip-flop 35 may comprise a 54S174 type unit marketed by the Fairchild Camera and Instrument Corporation, 313 Fairchild Drive, Mountain View, Calif. The information on the D input, i.e., the output of comparator 25, is transferred to the Q output during the low-to-high transition of the clock signal. This flip-flop unit 35 has a nominal set-up time of approximately 25 nanoseconds, i.e., the nominal settling time for the data port signal to settle to a reliable level. Thus, the delay line 30 interposes a 25 nanosecond delay to guarantee crossover bit (XOVER) detectability, and is matched with the flip-flop set-up time. This delay line may be eliminated if the set-up time of the particular flip-flop is very small.

As discussed above, the detected input RF signal RFA1, through the comparator 20 and delay line 30, provides the time reference, or clock, for the crossover bit. Thus, when clocked by the delay line 30 output, the flip-flop output will be high if the output of comparator 25 is high, i.e., if there is RF power being generated by the TWT, indicating that the cathode current is being applied to the tube. The flip-flop output will be low if the comparator 25 output is low, indicating that no TWT RF output and no cathode current is present.

The crossover condition occurs when the cathode current, $i_k$, is delayed enough to affect the leading edge of the TWT RF signal. At this point, the state of the crossover bit will be reversed.

The Q output of flip-flop 35 is provided to controller 60 on line 37. The controller 60 comprises a microprocessor 62, such as a model 8085AH, marketed by the Intel Corporation, 3065 Bowers Avenue, Santa Clara, Calif., and an input/output peripheral device 64, such as an Intel model M8155H random access memory with I/O ports and timer. Peripheral device 64 interfaces the microprocessor 62 with certain other elements of the system.

The output of controller 60 is coupled to digital-to-analog converter (DAC) 40, such as a model DAC 90SG, marketed by Burr-Brown, Tuscon, Ariz. The current output of the DAC 40 is used to drive the timing input of a monostable (one-shot) multivibrator 45. As the output current of the DAC 40 increases, the output pulse width of the multivibrator 45 decreases. Conversely, a decrease in output current of the DAC 40 increases the output pulse width of the multivibrator 45. The multivibrator 45 may comprise a Fairchild model 9602 retriggerable, resettable monostable multivibrator.

The trigger signal to the multivibrator 45 is provided by the system trigger signal on line 42. The output of the multivibrator 45 is provided on line 48 to a trigger driver comprising the cathode current generator 50. The trailing edge of the pulse on line 48 from the multivibrator 45 is used to initiate the "on" trigger for the cathode current pulse. Thus, the controller 60 is adapted to control the delay time between the system trigger pulse and the cathode current pulse.

The system trigger is coupled to one input of a multiplexer 55 on line 51, and is also coupled through a delay line 50 to a second input of the multiplexer 55 on line 52. The delay line 50 may comprise a Bell Fuse device, part number 0447-0050-05, adapted to provide a 50 nanosecond delay in the disclosed embodiment. The multiplexer 55 may comprise a Fairchild type 54LS157 multiplexer, which selects either the undelayed system trigger on line 51 or the delayed system trigger on line 52 as selected by the controller 60 via input/output peripheral device 64.

During the normal operation mode of the alignment system, the undelayed system trigger provides the trigger signal for the multivibrator 45. However, during the calibration mode, the multiplexer 55 is controlled to select the delayed system trigger signal on line 52, so that the multivibrator 45 trigger is the delayed system trigger pulse. The leading edge of the cathode current pulse is then aligned in temporal relation with the leading edge of the RF input signal pulse during the calibration mode.

During the normal operation mode, the multiplexer 55 selects the undelayed system trigger pulse on line 51, so that with the DAC 40 supplying the current level determined to align the pulses, the cathode current "on" trigger is started 50 nanoseconds before the RF input signal pulse. For the particular application in which the preferred embodiment is employed, it is desired that the trigger signal to turn on the cathode current pulse be applied well before the RF input signal is applied. The cathode current before the RF input signal is applied. The cathode current pulse has a finite rise-time, and applying the trigger pulse to turn on the cathode current before the RF input pulse allows time for the current pulse to rise. For other applications, such an offset may not be required, and the magnitude of the specific offset, 50 nanoseconds, is also application dependent.

Figure 4:
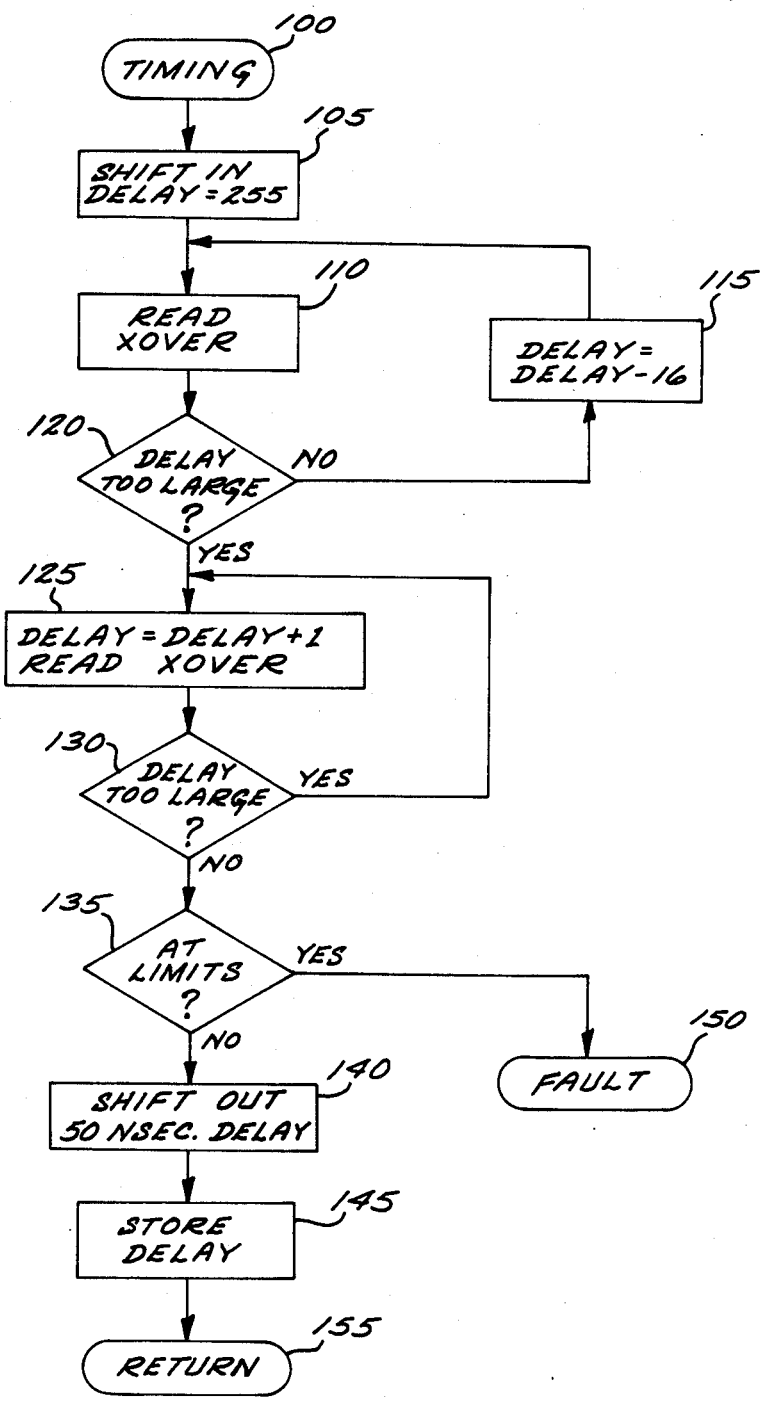
FIG. 4 is a flowchart illustrative of the alignment algorithm carried out by the preferred embodiment of the invention.

In the calibration mode, the controller 60 performs an alignment algorithm to automatically determine and store the necessary delay needed to align the cathode current pulse with the RF input signal pulse. A simplified flowchart of the alignment algorithm is shown in FIG. 4. At step 105, the DAC 40 is set at decimal 255, its highest current level, resulting in the minimum delay between the system trigger pulse and the cathode current pulse. The delayed system trigger signal is selected via multiplexer 55.

In the next step 110, the crossover bit (the Q output of D flip-flop 35) is tested by controller 60. As described above, the XOVER bit is at the high state when the amount of the delay is less than the amount needed for alignment, and at the low state when the amount of the delay is greater than that needed for alignment. If the XOVER bit is at the high state, i.e., the amount of the delay is too small, the DAC 40 decimal value is reduced by 16 at step 115 by the controller 60, and the crossover bit is retested at step 110. Steps 110, 120 and 115 are repeated until the crossover bit tests in the low state. The loop comprising steps 110, 120 and 115 results in stepping the delay through relatively large steps, i.e., the algorithm is adapted to "jam" the delay setting to quickly arrive at the approximate delay range of the optimum delay value.

Once the crossover bit tests in the low state at step 120, i.e., once the amount of the delay becomes too large, fine tuning is performed. The decimal number of the delay is increased by steps of 1 decimal to reduce the delay, at step 125, and the crossover bit is retested at step 130 by the controller 60 until the crossover bit returns to the high state.

At this point, the timing adjustment is complete, and the DAC 40 decimal number value of the optimum delay should be in the range of 1 through 254. This is tested at step 135 and if instead, the value is 0 or 255, representing the limits of DAC 40, timing adjustment is not possible and a fault is indicated at step 150. Such a fault could occur, for instance, from a degraded RF input signal waveform or a failure in the circuitry illustrated in FIG. 3. If no fault is detected, the multiplexer 55 is controlled at step 140 to select the non-delayed system trigger, and at step 145 the determined, optimum delay parameter for the DAC 40 is stored in an electrically-erasable-programmable-read-only-memory (EEPROM), to eliminate the need for retiming in the event of any power interruption to the system.

During the normal operation mode of the system, the controller 60 sets the DAC 40 to the determined optimum parameter value and controls the multiplexer 55 to select the non-delayed system trigger. Thus, during the normal opertion mode, the trigger signal for the cathode current pulse is applied 50 nanoseconds before the RF input pulse is applied to the TWT, giving the cathode current time to rise. The timing will not be readjusted until another calibration cycle is performed.

The preferred embodiment has been found to provide a delay range of from 400 to 1400 nanoseconds. The measured alignment time is less than 10 milliseconds.

TWT cathode pulse and RF input pulse realignment should be performed whenever any unit in the TWT amplifier system is changed, since each unit may contribute different timing/delay differences. The invention provides the capability to rapidly and accurately perform the alignment process without significant operator involvement, other than initiating the alignment process. The requirement for field alignment equipment is eliminated, as is the possibility for operator error in performing the alignment manually. The calibration sequence can be performed frequently to maintain a high level of alignment between the pulses. Thus, the efficiency of the pulsed TWT amplifier is increased.

A system for automatically aligning the coincidence of two pulses has been disclosed. It is understood that the above-described embodiment is merely illustrative of the present invention. Numerous and varied other arrangements may be devised in accordance with the principles of the invention by those skilled in the art without departing from the scope of the invention.

What is claimed is:

1. An automated method for aligning first and second pulse signals in relation to each other where the second pulse signal is generated at a substantially fixed time delay after a reference trigger signal, comprising the steps of:
   providing a variable time delay means for varying the time delay between said trigger signal and said first pulse signal;
   providing a means for generating a coincidence signal indicating when said first pulse signal is in coincidence with said second pulse signal, and
   in an iterative process, stepping said time delay means through a plurality of time delays while monitoring said coincidence signal to find the time delay parameter resulting in the coincidence of said first pulse signal and said second pulse signal.

2. The method of claim 1 further comprising the step of storing in a memory device impervious to electrical power interruption said time delay parameter for subsequent retrieval.

3. The method of claim 1 wherein said coincidence signal has a first state corresponding to the condition wherein the amount of said time delay is too small to achieve coincidence, and a second state corresponding to the condition wherein said time delay is too great to achieve coincidence, and in said iterative process, the time delay means is stepped through said plurality until the coincidence signal changes states, then stepped in opposite directions in smaller steps until the coincidence signal changes state again, at which time the delay parameter is found.

4. The invention of claim 3 wherein said time delay means is adapted to vary said time delay between a minimum delay and a maximum delay in dependence on a delay parameter, and wherein said iterative process comprises the steps of:
   (i) setting said variable time delay means at the delay parameter resulting in the minimum time delay between said trigger signal and said first signal;
   (ii) reading the state of said coincidence signal;
   (iii) increasing said time delay by changing said parameter value by a first predetermined value;
   (iv) reading the state of said coincidence signal to determine if the state of said coincidence signal has changed; and
   (v) repeating steps (iii) and (iv) until the state of said coincidence signal changes.

5. The method of claim 4 wherein said iterative process further comprising the steps of
   (vi) after the state of said coincidence signal has changed, decreasing the time delay by changing said parameter value by a second predetermined value corresponding to a smaller difference in the time delay than said first predetermined value;
   (vii) reading the states of said coincidence signal;
   (viii) repeating steps (vi) and (vii) until the state of said coincidence signal changes a second time; and
   (ix) identifying the delay parameter resulting in the second change of state of said coincidence signal as the time delay parameter resulting in the coincidence of said first signal and said second signal.

6. A system for aligning first and second pulse signals so that they coincide, comprising:
   programmable timing means for timing the incidence of the first pulse signal in response to timing parameter signals;
   pulse coincidence means for generating a coincidence signal indicative of the temporal relationship of the first and second pulses; and
   controller means for providing said timing parameter signals to said programmable timing means, said controller means being operable in a calibration mode for progressively stepping the programmable timing means through a range of timing parameter values and monitoring the coincidence signal to determine a calibrated value for the timing parameter signal corresponding to the timing of the first pulse signal necessary for coincidence between the first and second pulses, and said controller means is further operable in an operational mode for controlling the timing parameter value of said programmable timing means in dependence on said calibrated value.

7. The system of claim 6 wherein said coincidence signal has first and second states, the first state indicative of the condition wherein said first pulse is initiated before said second pulse, and said second state is indicative of the condition wherein said first pulse is initiated after said second pulse, and the coincidence of the two pulses is indicated by crossover of said coincidence signal from one state to the other, whereby said controller means determines the coincidence of the first and second pulses by receiving the change in state of said coincidence signal.

8. The system of claim 7 wherein, during said calibration mode, said controller means iteratively steps the programmable timing means through a plurality of timing parameter values while monitoring the coincidence signal to determine a crossover point wherein the coincidence signal switches from one state to the other as a result of a change in the timing parameter.

9. The system of claim 7 wherein, during said calibration mode, said controller means is also for programming said programmable timing means to a minimum timing setting, and for iteratively increasing the timing parameter by a predetermined first parameter value until said coincidence signal changes states, and thereafter for decreasing the timing parameter by a predetermined second parameter value until said coincidence signal changes states a second time.

10. The system of claim 9 wherein said calibrated value is the delay parameter value resulting in the second change of state of said coincidence signal.

11. The system of claim 10 wherein said predetermined second parameter value is less than said first predetermined parameter value.

12. In a pulsed traveling-wave-tube (TWT) amplifier, a system for aligning the TWT cathode current pulse with the input RF pulse to the TWT, comprising:
  current pulse means for initiating a cathode current pulse in response to a cathode current trigger signal;
  variable timing means for controlling the initiation of said cathode current pulse in response to timing parameter signals;
  pulse alignment indicating means for generating an alignment signal indicative of the temporal relationship of the cathode current pulse and the RF input pulse;
  central processor means for providing said timing parameter signals to said variable timing means so as to align said current pulse and said RF input pulse.

13. The system of claim 12 wherein said central processor means is also for operating in a calibration mode wherein the variable timing means is iteratively varied and said alignment signal is monitored so as to determine the calibrated timing parameter signal resulting in alignment of the current pulse and the RF input pulse.

14. The system of claim 13 wherein said central processor means operating in said calibration mode is also for initializing said variable timing means to a minimum timing parameter value, and for incrementing the timing means in progressive timing parameter steps while monitoring said alignment signal as the TWT amplified is pulsed so as to determine the calibrated timing parameter.

15. The system of claim 12 further comprising input RF pulse detector means for providing a first signal indicative of the input RF signal level to the TWT amplifier, and TWT RF detector means for providing a second signal indicative of the level of the TWT RF output, and wherein said pulse alignment means is responsive to said first and second signals.

16. The system of claim 15 wherein said pulse alignment means is for employing said first signal as the basis for a time reference signal, and further comprises means for providing a binary-level alignment signal having a first state indicative of the condition wherein said current pulse leads said RF input pulse, and a second state indicative of the condition wherein said current pulse lags said RF input pulse.

17. The system of claim 16 wherein said first signal is coupled to a first comparator means adapted to provide a first binary-level signal indicative of the "on/off" status of said RF input pulse, and said second signal is coupled to a second comparator means for providing a second binary-level signal indicative of the "on/off" status of said TWT RF signal, and said pulse alignment means further comprises a flip-flop means clocked by said first binary-level signal, and whose output is dependent on the state of said binary-level signal when clocked by said first binary-level signal.

18. An automated method for aligning first and second pulse signals in relation to each other where the second pulse signal is generated at a substantially fixed time delay after a reference trigger signal, comprising the steps of:
  providing a variable time delay means for varying the time delay between said trigger signal and said first pulse signal and for setting said time delay in response to a time delay parameter;
  generating a coincidence signal indicating when said first pulse signal is in coincidence with said second pulse signal;
  in an interative process, stepping said time delay means through a plurality of time delays while monitoring said coincidence signal to find the time delay parameter resulting in the coincidence of said first pulse signal and said second pulse signal; and
  supplying said time delay parameter to said variable time delay means.

* * * * *